(12) United States Patent
Takamatsu et al.

(10) Patent No.: US 11,104,099 B2
(45) Date of Patent: Aug. 31, 2021

(54) THERMALLY CONDUCTIVE RESIN SHEET HAVING LIGHT TRANSMISSION AND METHOD FOR PRODUCING THE SAME

(71) Applicant: Shin-Etsu Chemical Co., Ltd., Tokyo (JP)

(72) Inventors: Yoshinori Takamatsu, Annaka (JP); Kazuaki Sumita, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 430 days.

(21) Appl. No.: 16/149,728

(22) Filed: Oct. 2, 2018

(65) Prior Publication Data

US 2019/0099980 A1 Apr. 4, 2019

(30) Foreign Application Priority Data

Oct. 3, 2017 (JP) .............................. JP2017-193321

(51) Int. Cl.
  *B32B 5/02* (2006.01)
  *H01L 33/64* (2010.01)
  (Continued)

(52) U.S. Cl.
  CPC ................ *B32B 5/024* (2013.01); *B32B 5/26* (2013.01); *B32B 27/08* (2013.01); *H01L 33/641* (2013.01);
  (Continued)

(58) Field of Classification Search
  CPC ......... C08J 5/24; H05K 1/0366; H05K 9/009; H05K 7/20963; H05K 7/02–963; Y10T 428/24124; Y10T 428/2915; Y10T 442/3309; Y10T 442/2984; Y10T 442/3293; Y10T 442/3472; Y10T 428/3309; Y10T 428/2984; Y10T 428/3293; Y10T 428/3472; Y10T 442/24124; Y10T 442/2915;
  (Continued)

(56) References Cited

U.S. PATENT DOCUMENTS 5,401,564 A * 3/1995 Lee ........................ A43B 7/226
                                              139/420 A
7,439,475 B2   10/2008 Ohta

FOREIGN PATENT DOCUMENTS

JP    2007-91884 A     4/2007
JP    2007-326976 A    12/2007
(Continued)

OTHER PUBLICATIONS

Thermtest Top 10 Thermally Conductive Materials, accessed online Jan. 30, 2021.*

*Primary Examiner* — Camie S Thompson
(74) *Attorney, Agent, or Firm* — Birch, Stewart, Kolasch & Birch, LLP

(57) ABSTRACT

Provided are a thermally conductive resin sheet having light transmission, including a cured product of a fiber cloth-containing thermally conductive resin composition prepared by thermally curing or semi-curing a laminate composed of five or more sheets of a prepreg made by impregnating a fiber cloth made of thermally conductive fibers as warp and white or transparent fibers as weft with a transparent curable resin composition, the cured product having a cut surface vertical to a length direction of the thermally conductive fibers, and a method for producing the thermally conductive resin sheet.

10 Claims, 2 Drawing Sheets

(51) Int. Cl.
*H05K 7/20* (2006.01)
*B32B 5/26* (2006.01)
*B32B 27/08* (2006.01)
*F28F 21/00* (2006.01)
*F28F 21/06* (2006.01)
*F28F 21/08* (2006.01)

(52) U.S. Cl.
CPC ...... *H05K 7/20963* (2013.01); *B32B 2250/05* (2013.01); *B32B 2307/302* (2013.01); *B32B 2307/412* (2013.01); *F28F 21/006* (2013.01); *F28F 21/06* (2013.01); *F28F 21/084* (2013.01); *H01L 2933/0075* (2013.01)

(58) Field of Classification Search
CPC ........ B29K 2105/0845; B29K 2309/08; B29K 2995/0005; B29C 61/0658; D03D 11/00; B32B 5/26; B32B 5/08; B32B 5/024; B32B 27/08; B32B 2307/302; B32B 2307/412; B32B 2307/718; B32B 2260/046; B32B 2260/0276; B32B 2260/062; B32B 2260/101; B32B 2260/103; B32B 2260/105; B32B 2260/106; B32B 2260/14; B32B 2260/023; B32B 2250/05; B32B 15/14; F28F 21/006; F28F 21/06; F28F 21/084
USPC ........ 428/113, 175, 365; 442/217, 239, 179; 174/117 M; 139/425 R; 264/241, 258, 264/324

See application file for complete search history.

(56) References Cited

FOREIGN PATENT DOCUMENTS

| | | |
|---|---|---|
| JP | 2012-229316 A | 11/2012 |
| JP | 2017-78122 A | 4/2017 |

\* cited by examiner

THERMALLY CONDUCTIVE RESIN SHEET HAVING LIGHT TRANSMISSION AND METHOD FOR PRODUCING THE SAME

CROSS-REFERENCE TO RELATED APPLICATION

This non-provisional application claims priority under 35 U.S.C. § 119(a) on Patent Application No. 2017-193321 filed in Japan on Oct. 3, 2017, the entire contents of which are hereby incorporated by reference.

TECHNICAL FIELD

The present invention relates to a thermally conductive resin sheet which is suitable as a heat dissipating material for LED lighting and displays, and a method for producing the same, and specifically to a thermally conductive resin sheet sufficiently achieving both, of light transmission and thermal conductivity, and a method for producing the same.

BACKGROUND ART

In recent years, with the advancement of high performance of semiconductor devices and LEDs, highly thermally conductive resin materials are demanded to have higher thermal conductivity for dissipating heat generated by semiconductor devices to the outside. In particular, heat-dissipating materials used in LED lighting and displays are required to achieve both of light transmission and thermal conductivity. However, in order to increase thermal conductivity of resin materials, inorganic fillers such as alumina must be charged, which can cause a problem of loss of light transmission. Additionally, the use of inorganic materials such as diamond achieves high thermal conductivity and transparency, but they are hard and costly, and difficult to be molded, so that its uses are limited. Therefore, development of a highly thermally conductive resin material having both of light transmission and flexibility is demanded.

As a resin composition having transparency and high thermal conductivity, a technique using a thermal conductivity filler composed of thermal conductivity particles having a refraction layer on their surface is proposed (see Patent Document 1). However, in this technique, high thermal conductivity cannot be achieved because of the surface treatment for the thermally conductive particles, so that the thermal conductivity is not higher than 1 W/mK. Additionally, a transparent and high conductive resin composition made of a transparent resin material and a thermally conductive filler having a close refraction index is proposed (see Patent Document 2). However, this technique uses magnesium hydroxide as a thermally conductive filler, so that thermal conductivity is at most about 2 W/mK. Furthermore, a resin composition having transparency and high thermal conductivity made of submicron carbon fibers having a high aspect ratio is proposed (see Patent Document 3). However, this technique has not achieved high thermal conductivity, because the filling amount of carbon fibers is extremely small, and fibers are not oriented. Additionally, a thermally conductive resin composition including carbon fibers oriented in one direction by a magnetic field is proposed (see Patent Document 4). A resin sheet having thermal conductivity of 50 W/mK or more is obtained by this technique, but it has no light transmission. Furthermore, this technique requires a superconductive coil magnet in the manufacturing process, which makes its production difficult. All of the above-described prior art technique will not sufficiently achieve both of light transmission and high thermal conductivity.

CITATION LIST

Patent Document 1: JP-A 2017-78122
Patent Document 2: JP-A 2012-229316
Patent Document 3: JP-A 2007-91884
Patent Document 4: JP-A 2007-326976

SUMMARY OF THE INVENTION

The present invention has been made in view of the above-described circumstances, and it is therefore an object of the present invention is to provide a thermally conductive resin sheet having excellent light transmission and high thermal conductivity, and a method for producing the same.

The inventors carried out dedicated researches for achieving the above-described object, and found that a thermally conductive resin sheet having excellent light transmission and high thermal conductivity is obtained by laminating five or mor layers of a prepreg, which has been made by impregnating a fiber cloth made of thermally conductive fibers as warp and white or transparent fibers as weft with a transparent curable resin composition, and cutting the cured product thus obtained at the surface vertical to the length direction of the thermally conductive fibers, and further found that the thermally conductive resin sheet can be relatively easily made, and thus have completed the present invention.

Accordingly, the present invention provides the following thermally conductive resin sheet and a method for producing the same.

[1] A thermally conductive resin sheet having light transmission, including a cured product of a fiber cloth-containing thermally conductive resin composition prepared by thermally curing or semi-curing a laminate composed of five or more sheets of a prepreg made by impregnating a fiber cloth made of thermally conductive fibers as warp and white or transparent fibers as weft with a transparent curable resin composition, the cured product having a cut surface vertical to a length direction of the thermally conductive fibers.

[2] The thermally conductive resin sheet of [1], wherein the thermally conductive fibers have thermal conductivity of 200 W/mK or more in the length direction.

[3] The thermally conductive resin sheet of [1], wherein the thermally conductive fibers are oriented vertically to, the cut surface of the cured product, and have light transmission, in a direction parallel to the thermally conductive fibers.

[4] The thermally conductive resin sheet of [1], wherein the white or transparent fibers are one or more selected from the group of glass fibers, alumina fibers, cellulose fibers, polyester fibers, and polyethylene fibers.

[5] The thermally conductive resin sheet of [1], wherein a proportion of warp in the fiber cloth is 40% by weight or more, and the weight of the fiber cloth per 1 $m^2$ is 10 to 500 $g/m^2$.

[6] The thermally conductive resin sheet of [1], wherein the curable resin composition is one or more selected from the group of thermosetting silicone resin compositions, photo-curable silicone resin compositions, and thermosetting epoxy resin compositions.

[7] The thermally conductive resin sheet of [1], which has thermal conductivity of 4 W/mK or more in a direction parallel to the thermally conductive fibers.

[8] The thermally conductive resin sheet of [1], wherein the thermally conductive resin sheet has light transmittance of 70% or more in a direction parallel to the thermally conductive fibers at a thickness of 1 mm.

[9] The thermally conductive resin sheet of [7], wherein the thermally conductive resin sheet has thermal conductivity of 20 W/mK or more in a direction parallel to the thermally conductive fibers, and has light transmittance of 30% or more in a direction parallel to the thermally conductive fibers at a thickness of 1 mm.

[10] A method for producing a thermally conductive resin sheet, including laminating five or more sheets of a prepreg made by impregnating a fiber cloth made of thermally conductive fibers as warp and white or transparent fibers as weft with, a transparent curable resin composition, and thermally curing or semi-curing the laminate to obtain a cured product of a fiber cloth-containing thermally conductive resin composition, and then cutting the cured product at a surface vertical to a length direction of the thermally conductive fibers.

[11] A method for producing a thermally conductive resin sheet, including making a single layer cured product by thermally curing a prepreg made by impregnating a fiber cloth made of thermally conductive fibers as warp and white or transparent fibers as weft with a transparent curable resin composition, and then applying an uncured resin composition to the surface of the cured product, laminating five or more sheets of the prepreg, and thermally curing or semi-curing the laminate to obtain a cured product of a fiber cloth-containing thermally conductive resin composition, and then cutting the cured product at a surface vertical to a length direction of the thermally conductive fibers to obtain a thermally conductive resin sheet.

ADVANTAGEOUS EFFECTS OF THE INVENTION

The thermally conductive resin sheet having light transmission of the present invention achieves excellent light transmission and high thermal conductivity. Additionally, according to the method of the present invention for producing a thermally conductive resin sheet, the above-described thermally conductive resin sheet can be relatively easily made, and a flexible resin sheet can be made owing to flexibility of a fiber material and a resin material.

DESCRIPTION OF THE PREFERRED EMBODIMENT

Figure 1A:
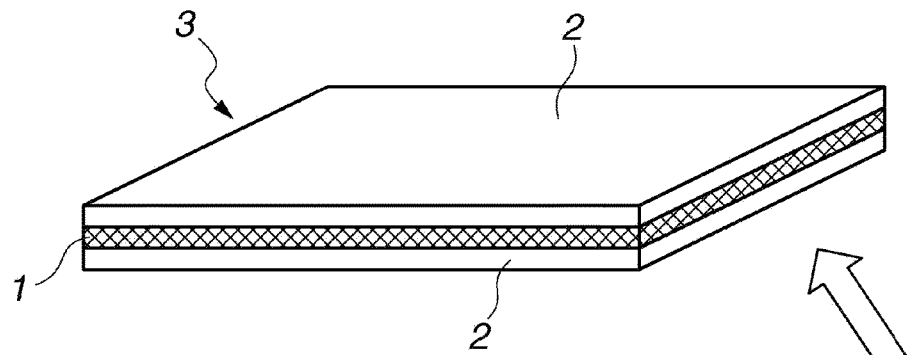
FIG. 1A is a schematic view of a prepreg made by impregnating a fiber cloth with a resin composition.

A thermally conductive resin sheet having light transmission of the present invention is specifically described below.

The thermally conductive resin sheet of the present invention includes a cured product of a fiber cloth-containing thermally conductive resin composition prepared by thermally curing or semi-curing a laminate composed of sheets of a prepreg made by impregnating a certain fiber cloth with a transparent curable resin composition.

Fiber Cloth

The fiber cloth used in the present invention is a cloth made of thermally conductive fibers as warp and white or transparent fibers as weft. The warp in the present invention means the fibers which are in the direction vertical to the final cut surface of the fiber cloth-containing thermally conductive resin cured product.

Specific examples of the thermally conductive fibers include graphitized carbon fibers, silicon carbide fibers, boron nitride nanotube fibers, silver fibers, aluminum, fibers, and copper fibers. Additionally, from the viewpoint of thermal conductivity, in the length direction of fibers (may be referred to as "fiber direction"), the use of thermally conductive fibers having thermal conductivity of preferably 200 W/mK or more, more preferably 500 W/mK or more is preferred, and the use of graphitized carbon fibers is particularly preferred from the viewpoints of its high thermal conductivity and high availability.

Additionally, white or transparent fibers are used as the weft of the fiber cloth. In particular, from the viewpoint of strength, the use of glass fibers, alumina fibers, cellulose fibers, polyester fibers, or polyethylene fibers is preferred, and from the viewpoint of flexibility, the use of polyester fibers is more preferred.

The method of weaving the fiber cloth is not particularly limited, for example, plain weave (including those having different proportions of the number of warp and weft), satin weave, and twill weave. Among them, from the viewpoints of thermal conductivity and transparency, plain weave using different weights and different, proportions of numbers of warp and weft.

The proportions of warp and weft of the fiber cloth may be optionally established; from the viewpoints of thermal conductivity and transparency, the proportion of warp is preferably 40% by weight or more, and more preferably 90% by weight or more of the entire fiber cloth. If the proportion of the thermally conductive fibers as warp is less than 40% by weight, thermal conductivity may be impaired, and light transmittance may decrease because of the increase of the proportion of weft. The upper limit of the proportion of the warp is preferably 99.99% by weight or less of the whole fiber cloth.

The weight of the fiber cloth per 1 m$^2$ is not particularly limited, but is preferably about 10 to 500 g/m$^2$, and more preferably 50 to 250 g/m$^2$. If the weight of the fiber cloth per 1 m$^2$ is less than 10 g/m$^2$, the density of the fibers decreases, and sufficient thermal conductivity may not be obtained. Additionally, if the weight is more than 500 g/m$^2$, impregnation of the resin may be difficult. The fiber cloth may be one- or two-ply or more. From the above viewpoints, the fiber cloth of the present invention is most preferably a disparate fiber cloth made of carbon fibers having thermal conductivity of 500 W/mK or more as warp in the length direction (fiber direction), and polyester fibers as weft, wherein the weight proportion of the carbon fibers is preferably 90% by weight or more and 99.9% by weight or less.

Curable Resin Composition having Transparency

The curable resin composition, having transparency used in the present invention uses a transparent resin material which is cured by heat or light. Alternatively, a resin material which is semi-cured by short time thermal treatment may be used.

The above-described "curable resin composition having transparency" means that the light transmittance of the resin cured product at a thickness of 1 mm is 80% or more as measured by the method described in JIS K 7136: 2000, and the light transmittance is preferably 90% or more. The light transmittance herein refers to the total light transmittance.

Specific examples of the "curable resin composition having transparency" include thermosetting silicone resin compositions, photocurable silicone resin compositions, and transparent epoxy resin compositions. Examples of the thermosetting silicone resin composition include, but not particularly limited, silicone resin compositions prepared by curing methylsilicone resins having alkenyl groups and silanol groups and the like, or phenyl silicone resins through addition reaction or condensation reaction of hydrosilylation. Examples of the transparent epoxy resin composition include bisphenol epoxy resins, triglycidyl isocyanurate, tetraglycidyl urea, and alicyclic epoxy resins cured with a curing agent such as alicyclic acid anhydride. Among them, thermosetting silicone resins are preferred from the viewpoints of flexibility and light transmission.

The "curable resin composition having transparency" may contain an inorganic filler such as silica, alumina, or nanofiller without impairing transparency, thereby improving strength and heat resistance of the resin.

Method for Producing Thermally Conductive Resin Sheet of the Present Invention

An example of the method for producing the thermally conductive resin sheet having light transmission of the present invention is described using drawings. In the present invention, a resin cured product, which includes a fiber cloth made of thermally conductive fibers as warp laminated in the same direction, is cut at the surface vertical to the length direction of the thermally conductive fibers, thereby achieving high thermal conductivity in the direction vertical to the cut surface, or the direction parallel to the thermally conductive fibers. Furthermore, the use of a transparent curable resin composition as the resin to be laminated allows passage of light in the resin portion of the laminated prepreg, whereby light transmission between the cut surfaces of the resin sheet is achieved. At this time, the thermally conductive fibers are parallel to the light direction, which markedly restrains light absorption. Furthermore, the use of white or transparent fibers as weft prevents light absorption by weft, and further achieves high light transmittance. Additionally, flexibility of the fiber material and resin material allows to make a flexible resin sheet.

Figure 1B:
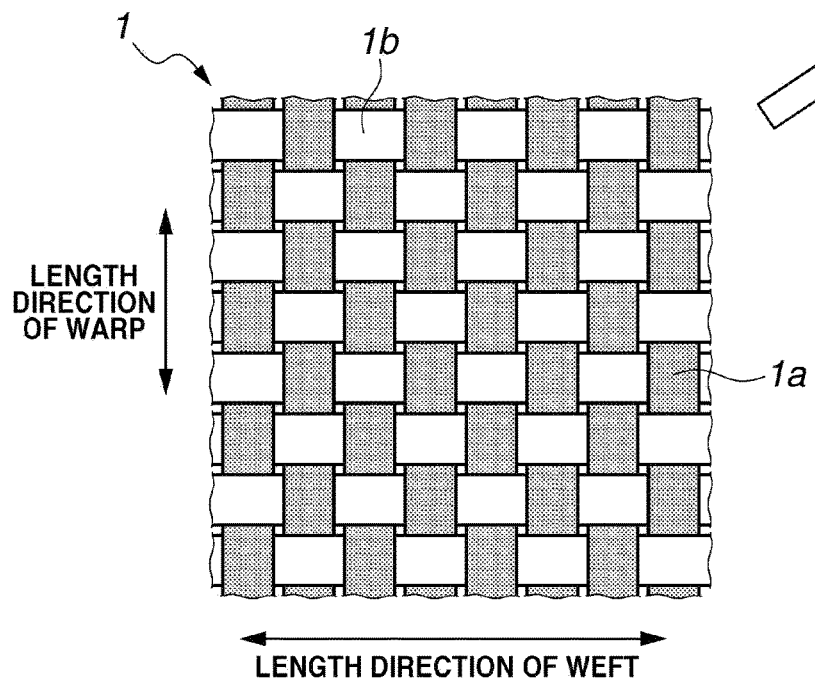
FIG. 1B is a schematic view of the fiber cloth.
Figure 1C:
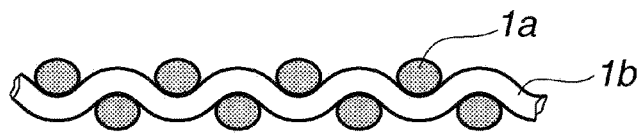
FIG. 1C is a schematic view of the fiber cloth seen from a weft direction.
Figure 2A:
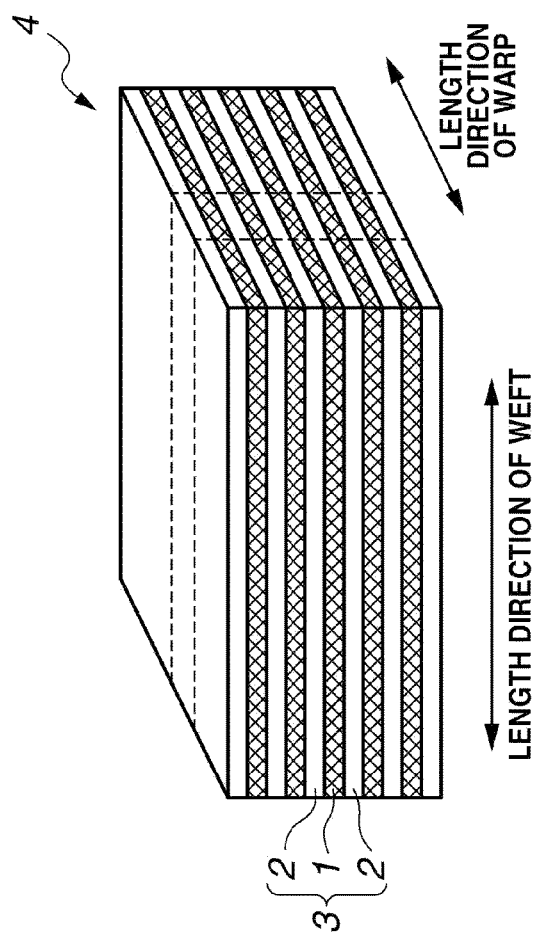
FIG. 2A is a schematic view of a fiber cloth-containing thermally conductive resin cured product prepared by laminating a prepreg.
Figure 2B:
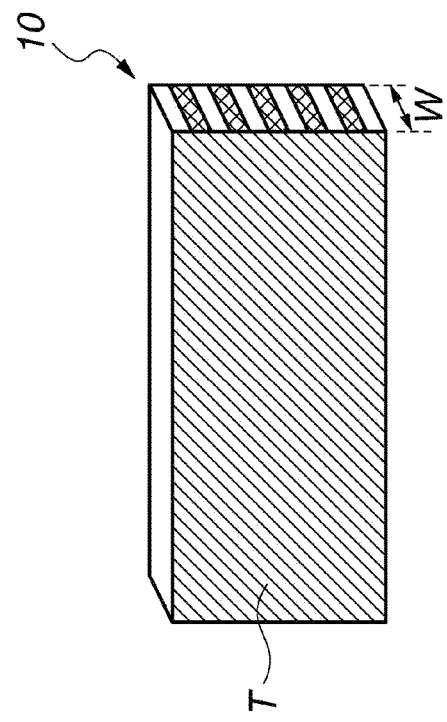
FIG. 2B is a schematic view of a thermally conductive resin sheet according to the present invention obtained by cutting the resin cured product in a predetermined manner.

As an example of the method for producing a thermally conductive resin sheet, firstly, as shown in FIG. 1B, a fiber cloth 1 having warp 1a and weft 1b is provided. The fiber cloth 1 is impregnated with a thermosetting silicone resin composition 2, thus making a prepreg 3 as shown in FIG. 1A. FIG. 1C is a transverse cut sectional view of the fiber cloth 1 seen from the length direction of weft. Subsequently, five or more sheets, preferably 20 to 500 sheets of the prepreg 3 are laminated in such a manner that the thermally conductive fibers (warp) 1a are in the same direction. If the number of the sheets of the prepreg 3 is within one to four, the laminate has a small thickness, which makes it difficult to make a thermally conductive resin sheet having desired light transmission. At that time, in order to reinforce the fiber cloth 1, the resin composition in an uncured state may be re-applied once to the cured thermosetting resin composition before lamination. Thereafter, the laminate is cured or semi-cured, whereby, as shown in FIG. 2A, a fiber cloth containing thermally conductive resin cured product 4 including plural sheets (five, sheets in the figure) of the prepreg 3 is obtained. Then, the fiber cloth-containing thermally conductive resin cured product 4 is sliced along the surface vertical to the length direction of the thermally conductive fibers (warp), namely the dotted line in the figure, thereby to obtain a thermally conductive resin sheet having light transmission 10 having a cut surface T vertical to the length direction of the thermally conductive fibers, as shown in FIG. 2(B). More specifically, within the thermally conductive resin sheet 10 thus obtained, the thermally conductive fibers (warp) 1a are densely oriented in the direction vertical to the cut surface T (see FIGS. 1B and 1C), thereby to achieve high thermal conductivity. On the other hand, the weft 1b is oriented in parallel to the cut surface T. From the viewpoints of light transmission and heat resistance, the cutting thickness (W) is preferably 2 mm or less.

Examples of the method for cutting the fiber cloth-containing thermally conductive resin cured product include a method using a cutting means such as a laser cutter, an ultrasonic cutter, or a diamond wire saw.

The fiber cloth content of the prepreg is preferably 3% by volume to 50% by volume with reference to the whole prepreg. If the content is less than 3% by volume, sufficient thermal conductivity may not be obtained, and if more than 50% by volume, light transmittance may decrease.

Additionally, in the present invention, a sticky layer or an adhesive layer may be formed on the cut surface of the resin sheet to be obtained without impairing light transmission.

EXAMPLES

The present invention is specifically described below with reference to Examples and Comparative Examples, but the present invention will not be limited to the following Examples.

In the following Examples, the viscosity is measured at 23° C. using a cone-plate shaped rotational viscometer described in JIS Z 8803: 2011 (corn plate-shaped viscometer, BROOK FIELD CP51 DV-III ULTRA), at a rotation speed of 1 rpm.

Example 1

A fiber cloth a (plain weave, 200 g/m$^2$, warp 95% by weight) made of graphitized carbon fibers (10 μm diameter, 500 W/mK) as warp and polyester fibers (5 μm diameter) as weft was made. Subsequently, the fiber cloth a was impregnated with an addition-curable silicone resin composition in a liquid state (viscosity: 4 Pa·s, light transmittance of the 1-mm-thick cured product: 96%), which had been prepared by adding dimethylsilicone oil as a diluent to a mixture of dimethylpolysiloxane having vinyl groups at both ends and a methylhydrogensiloxane/dimethylsiloxane copolymer, thereby making a prepreg. 75 sheets of the prepreg were laminated to a 5 cm thickness with the direction of the graphitized carbon fibers aligned, the laminate was cured by heating at 120° C. for 1 hour, thereby obtaining a fiber cloth-containing thermally conductive resin cured product A. The resin cured product A was cut into a 1 mm thickness piece at the surface vertical to the length direction (axial direction) of the carbon fibers, thereby obtaining a light transmitting thermally conductive resin sheet 1 (cloth content: 30% by volume) having 5 cm square×1 mm thick.

Example 2

The prepreg obtained in Example 1 as it is was cured by heating at 120° C., thereby obtaining a single layer cured product. To the cured product, the thermosetting silicone resin composition in a liquid state obtained in Example 1 was applied, 50 sheets of the prepreg was laminated with the direction of the graphitized carbon fibers aligned, and the laminate was cured by heating at 120° C., thereby obtaining a fiber cloth-containing thermally conductive resin cured product A'. The resin cured product A' was cut into a 1 mm thickness piece at the surface vertical to the length direction (axial direction) of the carbon fibers, thereby obtaining a light transmitting thermally conductive resin sheet 2 (cloth content: 20% by volume) having 5 cm square×1 mm thick.

Examples 3 and 4

A light transmitting thermally conductive resin sheet 3 (cloth content: 10% by volume) and a light, transmitting thermally conductive resin sheet 4 (cloth content: 5% by volume) were obtained, respectively, using the fiber cloth a in the same manner as in Example 1, except that the impregnation amount of the resin was adjusted.

Example 5

A fiber cloth b (plain weave, 200 g/m², warp 95% by weight) made of silicon carbide fibers (15 μm diameter. 270 W/mK) as warp and polyester fibers (5 μm diameter) as weft was made. The fiber cloth b was impregnated with a thermosetting silicone resin composition in a liquid state (viscosity: 4 Pa·s, light transmittance of the 1-mm-thick cured product: 96%), thereby making a prepreg. 75 sheets of the prepreg were laminated with the direction of the graphitized carbon fibers aligned, the laminate was cured by heating at 120° C., thereby obtaining a fiber cloth-containing thermally conductive resin cured product B. The resin cured product B was cut into a 1 mm thickness piece at the surface vertical to the axis of the silicon carbide fibers, thereby obtaining a light transmitting thermally conductive resin sheet 5 (cloth content: 20% by volume) having 5 cm square×1 mm thick.

Comparative Example 1

A fiber cloth c (plain weave, 200 g/m², warp 50% by weight) made of graphitized carbon fibers (10 μm diameter, 500 W/mK) as warp and graphitized carbon fibers (10 μm diameter, 500 W/mK) as weft was made. The fiber cloth c was impregnated with a thermosetting silicone resin composition in a liquid state (viscosity: 4 Pa·s, light transmittance of the 1-mm-thick cured product: 96%), thereby making a prepreg. 50 sheets of the prepreg were laminated with the direction of the graphitized carbon fibers aligned, the laminate was cured by heating at 120° C., thereby obtaining a fiber cloth-containing thermally conductive resin cured product C. The cured product was cut into a 1 mm, thickness piece at the surface vertical to the length direction (axis direction) of the carbon fibers of the cured product, thereby obtaining a light transmitting thermally conductive resin sheet 6 (cloth content: 20% by volume) having 5 cm square 1 mm thick.

Comparative Example 2

A light transmitting thermally conductive resin sheet 7 (cloth content: 25% by volume) was obtained in the same manner as in Example 1, except that a fiber cloth d (plain weave, 200 g/m², warp 50% by weight) made of glass fibers (15 μm diameter, 1 W/mK) as warp and weft was used.

Comparative Example 3

A light transmitting thermally conductive resin sheet 8 (cloth content: 30% by volume) was obtained in the same manner as in Example 1, except that a fiber cloth e (plain weave, 200 g/m², warp 5% by weight) made of polyester fibers (5 μm diameter) as warp and graphitized carbon fibers (10 μm diameter, 500 W/mK) as weft was used.

Comparative Example 4

A fiber cloth a (plain weave, 200 g/m², warp 95% by weight) made of graphitized carbon fibers (10 μm diameter, 500 W/mK) as warp and polyester fibers (5 μm diameter) as weft was made. Subsequently, the fiber cloth a was impregnated with a thermosetting silicone resin composition in a liquid state (viscosity: 4 Pa·s, light transmittance of the 1-mm-thick cured product: 96%), thereby making a prepreg. Four sheets of the prepreg were laminated with the direction of the graphitized carbon fibers aligned, the laminate was cured by heating at 120° C., thereby obtaining a fiber cloth-containing thermally conductive resin cured product A*. The cured product A* was cut into a 1-mm-thick piece at the surface vertical to the length direction (axial direction) of the carbon fibers, but the thickness of the laminate was so small that no light transmitting thermally conductive resin sheet was obtained.

<Thermal Conductivity of Resin Sheet>

A 1-mm-thick thermally conductive resin sheet having light transmission was processed into a disk having a diameter of 10 mm, and the thermal conductivity of the cut surface and the vertical direction was measured by the laser flash method according to the method described in JIS R 1611: 2011.

<Light Transmittance>

A 1-mm-thick thermally conductive resin sheet having light transmission was processed into a disk having a diameter of 50 mm, and the light transmittance at 450 nm was measured by using X-rite 8200 manufactured by S. D. G. K. K.

TABLE 1

| Component (part by weight) | Example | | | | | Comparative Example | | | |
|---|---|---|---|---|---|---|---|---|---|
| | 1 | 2 | 3 | 4 | 5 | 1 | 2 | 3 | 4 |
| Fiber cloth | a | a | a | a | b | c | d | e | a |
| Number of ply of fiber cloth | 75 | 50 | 25 | 13 | 50 | 50 | 60 | 75 | 4 |
| Content of fiber cloth (%) | 30 | 20 | 10 | 5 | 20 | 20 | 25 | 30 | 30 |
| Thermal conductivity of warp (W/mK) | 500 | 500 | 500 | 500 | 270 | 500 | 1 | 0.2 | 0.2 |
| Thermal conductivity of resin sheet (W/mK) | 65 | 45 | 28 | 15 | 23 | 22 | 0.7 | 0.5 | Sheet-shaped compound |
| Light transmittance (%) | 34 | 56 | 75 | 81 | 54 | 18 | 78 | 12 | was not obtained |

As given in Table 1, a fiber cloth including thermally conductive carbon fibers as warp was used in Examples 1 to 5, which allowed to achieve both of light transmission and high thermal conductivity more than 10 W/mK. Among them, the system including polyester as weft achieved high optical permeability. For example, the resin composition of Example 3 achieved thermal conductivity of more than 20 W/mK while keeping transmittance of 75%. It is difficult to make the material having such properties from a resin sheet other than the resin sheet of the present invention. Additionally, the resin sheet of Example 1 provided a material having light transmission and thermal conductivity as high as 65 W/mK, and such resin material is unknown. Comparative Example 2 using a glass cloth achieved high light transmittance, but the thermal conductivity did not exceed 1 W/mK. Comparative Example 3 used highly thermally conductive fibers as weft, so that high thermal conductivity was not achieved, and light transmittance was low because of light absorptivity of the weft. In the above-described Examples, resin materials having high thermal conductivity and light transmission were readily achieved without requiring a special apparatus such as a magnetic field.

Japanese Patent Application No. 2017-193321 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A thermally conductive resin sheet having light transmission, comprising a cured product of a fiber cloth-containing thermally conductive resin composition prepared by thermally curing or semi-curing a laminate composed of five or more sheets of a prepreg made by impregnating a fiber cloth made of thermally conductive fibers as warp and white or transparent fibers as weft with a transparent curable resin composition, the cured product having a cut surface vertical to a length direction of the thermally conductive fibers, wherein the thermally conductive fibers have thermal conductivity of 200 W/mK or more in the length direction.

2. The thermally conductive resin sheet of claim 1, wherein the thermally conductive fibers are oriented vertically to the cut surface of the cured product, and have light transmission in a direction parallel to the thermally conductive fibers.

3. The thermally conductive resin sheet of claim 1, wherein the white or transparent fibers are one or more selected from the group consisting of glass fibers, alumina fibers, cellulose fibers, polyester fibers, and polyethylene fibers.

4. The thermally conductive resin sheet of claim 1, wherein a proportion of warp in the fiber cloth is 40% by weight or more, and the weight of the fiber cloth per 1 $m^2$ is 10 to 500 $g/m^2$.

5. The thermally conductive resin sheet of claim 1, wherein the curable resin composition is one or more selected from the group consisting of thermosetting silicone resin compositions, photocurable silicone resin compositions, and thermosetting epoxy resin compositions.

6. The thermally conductive resin sheet of claim 1, which has thermal conductivity of 4 W/mK or more in a direction parallel to the thermally conductive fibers.

7. The thermally conductive resin sheet of claim 6, wherein the thermally conductive resin sheet has thermal conductivity of 20 W/mK or more in a direction parallel to the thermally conductive fibers, and has light transmittance of 30% or more in a direction parallel to the thermally conductive fibers at a thickness of 1 mm.

8. The thermally conductive resin sheet of claim 1, wherein the thermally conductive resin sheet has light transmittance of 70% or more in a direction parallel to the thermally conductive fibers at a thickness of 1 mm.

9. A method for producing a thermally conductive resin sheet, comprising:

laminating five or more sheets of a prepreg made by impregnating a fiber cloth made of thermally conductive fibers as warp and white or transparent fibers as weft with a transparent curable resin composition to obtain a laminate;

thermally curing or semi-curing the laminate to obtain a cured product of a fiber cloth-containing thermally conductive resin composition; and then cutting the cured product at a surface vertical to a length direction of the thermally conductive fibers, wherein the thermally conductive fibers have thermal conductivity of 200 W/mK or more in the length direction.

10. A method for producing a thermally conductive resin sheet, comprising:

making a single layer cured product by thermally curing a prepreg made by impregnating a fiber cloth made of thermally conductive fibers as warp and white or transparent fibers as weft with a transparent curable resin composition to obtain the cured product;

applying an uncured resin composition to a surface of the cured product;

laminating five or more sheets of the prepreg to obtain a laminate;

thermally curing or semi-curing the laminate to obtain a cured product of a fiber cloth-containing thermally conductive resin composition; and then cutting the cured product at a surface vertical to a length direction of the thermally conductive fibers to obtain a thermally conductive resin sheet, wherein the thermally conductive fibers have thermal conductivity of 200 W/mK or more in the length direction.

* * * * *